United States Patent
Riedl et al.

(10) Patent No.: US 10,615,145 B2
(45) Date of Patent: Apr. 7, 2020

(54) SOLDERING A CONDUCTOR TO AN ALUMINUM METALLIZATION

(71) Applicant: Infineon Technologies AG, Neubiberg (DE)

(72) Inventors: Edmund Riedl, Wald (DE); Wu Hu Li, Singapore (SG); Alexander Heinrich, Bad Abbach (DE); Ralf Otremba, Kaufbeuren (DE); Werner Reiss, Raubling (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/036,252

(22) Filed: Jul. 16, 2018

(65) Prior Publication Data
US 2019/0035764 A1 Jan. 31, 2019

(30) Foreign Application Priority Data
Jul. 31, 2017 (DE) .......................... 10 2017 213 170

(51) Int. Cl.
*H01L 23/00* (2006.01)
*H01L 23/498* (2006.01)
(Continued)

(52) U.S. Cl.
CPC ............ *H01L 24/83* (2013.01); *B23K 1/0016* (2013.01); *B23K 1/203* (2013.01); *B23K 35/268* (2013.01);
(Continued)

(58) Field of Classification Search
CPC . H01L 2224/92246; H01L 2224/73263; H01L 2224/84065; H01L 2224/84801; H01L 2224/84009; H01L 2224/40225; H01L 2224/32225; H01L 2224/05624; H01L 2224/04026; H01L 2224/04034; H01L 2224/37124; H01L 2224/83024; H01L 2224/27614; H01L 2224/27464;
(Continued)

(56) References Cited

U.S. PATENT DOCUMENTS

| 1,743,615 A | * | 1/1930 | Mahlie | B23K 35/3602 228/206 |
| 4,169,770 A | * | 10/1979 | Cooke | C25D 5/44 204/207 |

(Continued)

OTHER PUBLICATIONS

Makoto Hino et al., Effect of Zincate Treatment on Adhesion of Electroless Ni—P Coating onto Various Aluminum Alloys, 2009, Materials Transactions, vol. 50, No. 9 (2009) pp. 2235 to 2241 (Year: 2009).*

*Primary Examiner* — Syed I Gheyas
(74) *Attorney, Agent, or Firm* — Dicke, Billig & Czaja, PLLC

(57) ABSTRACT

A method of making a semiconductor including soldering a conductor to an aluminum metallization is disclosed. In one example, the method includes substituting an aluminum oxide layer on the aluminum metallization by a substitute metal oxide layer or a substitute metal alloy oxide layer. Then, substitute metal oxides in the substitute metal oxide layer or the substitute metal alloy oxide layer are at least partly reduced. The conductor is soldered to the aluminum metallization using a solder material.

10 Claims, 7 Drawing Sheets

(51) Int. Cl.
*B23K 1/00* (2006.01)
*B23K 1/20* (2006.01)
*B23K 35/26* (2006.01)
*B23K 35/28* (2006.01)
*B23K 101/38* (2006.01)

(52) U.S. Cl.
CPC .......... *B23K 35/282* (2013.01); *B23K 35/288* (2013.01); *H01L 23/49866* (2013.01); *H01L 24/05* (2013.01); *H01L 24/32* (2013.01); *H01L 24/37* (2013.01); *H01L 24/40* (2013.01); *H01L 24/73* (2013.01); *H01L 24/84* (2013.01); *H01L 24/92* (2013.01); *B23K 2101/38* (2018.08); *H01L 2224/04026* (2013.01); *H01L 2224/04034* (2013.01); *H01L 2224/05624* (2013.01); *H01L 2224/27462* (2013.01); *H01L 2224/27464* (2013.01); *H01L 2224/27614* (2013.01); *H01L 2224/32225* (2013.01); *H01L 2224/37124* (2013.01); *H01L 2224/40225* (2013.01); *H01L 2224/73263* (2013.01); *H01L 2224/83024* (2013.01); *H01L 2224/83065* (2013.01); *H01L 2224/83801* (2013.01); *H01L 2224/84009* (2013.01); *H01L 2224/84065* (2013.01); *H01L 2224/84801* (2013.01); *H01L 2224/92246* (2013.01); *H01L 2924/05432* (2013.01)

(58) Field of Classification Search
CPC . H01L 2224/27462; H01L 2224/83065; H01L 2224/83801
See application file for complete search history.

(56) References Cited

U.S. PATENT DOCUMENTS

| | | | |
|---|---|---|---|
| 6,178,623 B1* | 1/2001 | Kitazawa | C25D 5/10 156/47 |
| 6,503,343 B1 | 1/2003 | Tench et al. | |
| 2005/0104207 A1 | 5/2005 | Dean et al. | |
| 2005/0178669 A1* | 8/2005 | Strubbe | C23C 18/1653 205/185 |
| 2006/0183270 A1* | 8/2006 | Humpston | B23K 3/0623 438/106 |
| 2013/0221507 A1* | 8/2013 | Niu | H01L 23/49562 257/676 |
| 2016/0175994 A1* | 6/2016 | Pandher | B23K 35/262 228/223 |

* cited by examiner

SOLDERING A CONDUCTOR TO AN ALUMINUM METALLIZATION

CROSS-REFERENCE TO RELATED APPLICATION

This Utility Patent Application claims priority to German Patent Application No. 10 2017 213 170.5, filed Jul. 31, 2017, which is incorporated herein by reference.

TECHNICAL FIELD

This disclosure relates generally to the technique of soldering in semiconductor device manufacturing, and in particular to aspects of soldering a conductor to an aluminum metallization.

BACKGROUND

Soldering processes are widely used in semiconductor device manufacturing for a variety of purposes, including chip bonding, wire/clip/ribbon bonding, device mounting etc. A variety of solder materials, fluxes, and soldering techniques is available. Soldering methods and soldering substances can have a high impact on cost, yield, performance and reliability of a semiconductor device.

Soldering of aluminum (Al) metallizations requires the application of highly reactive chemicals (fluxes) to remove the highly stable $Al_2O_3$ layer on Al metallizations. Such highly reactive chemicals are incompatible with standard semiconductor manufacturing processes. Therefore, soldering on Al surfaces today is limited to applications outside of semiconductor device manufacturing.

SUMMARY

An aspect of the disclosure relates to a method of soldering a conductor to an aluminum metallization. The method includes substituting an aluminum oxide layer on the aluminum metallization by a substitute metal oxide layer or a substitute metal alloy oxide layer. A substitute metal oxide in the substitute metal oxide layer or the substitute metal alloy oxide layer is at least partly reduced. The conductor is soldered to the aluminum metallization using a solder material.

Another aspect of the disclosure relates to a method of soldering a conductor to an aluminum metallization. The method includes applying a flux material to an aluminum oxide layer on the aluminum metallization. A solder material is disposed over the aluminum metallization, wherein the solder material has a chemical composition in percent by weight (% wt) of x % wt≤Zn≤100% wt, with x=10, 30, 50, 70, 90, 95, or 100. The conductor is then soldered to the aluminum metallization.

Another aspect of the disclosure relates to a method of soldering a conductor to an aluminum metallization. The method includes applying a halogenide via a plasma process to an aluminum oxide layer on the aluminum metallization to produce a halogenated aluminum oxide layer. A solder material is disposed over the halogenated aluminum oxide layer. The conductor is then soldered to the aluminum metallization.

Another aspect of the disclosure relates to an arrangement of a conductor and an aluminum metallization soldered together. The arrangement includes a substitute metal layer or a substitute metal alloy layer disposed over the aluminum metallization, wherein a substitute metal of the substitute metal layer or the substitute metal alloy layer may be one of Zn, Cr, Cu, Pb, or Sn. The arrangement further includes a solder layer arranged between the substitute metal layer or the substitute metal alloy layer and the conductor.

BRIEF DESCRIPTION OF THE DRAWINGS

The accompanying drawings are included to provide a further understanding of aspects and are incorporated in and constitute a part of this specification. The drawings illustrate aspects of the disclosure and together with the description serve to explain principles of aspects of the disclosure. Other aspects and many of the intended advantages of aspects will be readily appreciated as they become better understood by reference to the following detailed description. The elements of the drawings are not necessarily to scale relative to each other. Like reference signs may designate corresponding similar parts. It is to be understood that the features of the various examples of embodiments described below may be combined with each other, unless specifically noted otherwise.

DETAILED DESCRIPTION

Figure 1A:
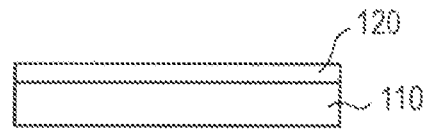
FIG. 1A is a cross-sectional view illustrating an example of an aluminum metallization and an aluminum oxide layer on the aluminum metallization.

In the following detailed description, reference is made to the accompanying drawings, which form a part thereof, and in which is shown by way of illustration specific embodiments. In this regard, directional terminology, such as "top", "bottom", "front", "back", "upper", "lower", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present description. The following detailed description, therefore, is not to be taken in a limiting sense.

As employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the word "over" used with regard to a part, element or material layer formed or located "over" a surface may be used herein to optionally mean that the part, element or material layer be located (e.g. placed, formed, deposited, etc.) "directly on", e.g. in direct contact with, the implied surface. The word "over" used with regard to a part, element or material layer formed or located "over" a surface may be used herein to mean that the part, element or material layer be located (e.g. placed, formed, deposited, etc.) "indirectly on" the implied surface with one or more additional parts, elements or layers being arranged between the implied surface and the part, element or material layer.

Further, geometric terminology such as the words "perpendicular" and "parallel" etc. may be used herein with regard to a relative orientation of two or more components. It is understood that these terms may not necessarily mean that the specified geometric relation is realized in a perfect geometric sense. Instead, fabrication tolerances of the involved components may need to be considered in this regard. For example, if two surfaces of an encapsulation material of a semiconductor package are specified to be perpendicular (or parallel) to each other, an actual angle between these surfaces may deviate from an exact value of 90 (or 0) degrees by a deviation value that may particularly depend on tolerances that may typically occur when applying techniques for fabricating a housing made of the encapsulation material.

Further, an "alloy of X" (including further components Y, Z, . . . ) means that the contribution of X in % wt is greater than the contribution of Y in % wt and the contribution of Z in % wt, respectively. In particular, it may mean that the contribution of X is at least 50% wt.

The notation XY refers to an alloy of X including at least Y as a further component. In particular, it may refer to an alloy of X including Y as a sole residual component.

Embodiments of methods described herein may be used for soldering semiconductor devices such as, e.g., semiconductor chips, having electrically conducting electrodes to an aluminum substrate. Further, embodiments of methods described herein may be used for soldering semiconductor device aluminum metallization such as, e.g., chip aluminum electrodes to a metal substrate, wherein the metal substrate may comprise or be made of, e.g., copper, a copper alloy, aluminum, an aluminum alloy, etc.

As known in the art, an aluminum metallization is coated by a highly stable $Al_2O_3$ layer. $Al_2O_3$ has a free enthalpy of formation of $DGf^0 = -1582.3$ kJ/mol. This highly stable oxide protects the aluminum from solder attack with solderpastes containing fluxes which are usually used in semiconductor soldering, such as low activated fluxes based on kolophonium or other organic acids such as malonic acid or oxalic acid. The highly stable $Al_2O_3$ layer may be removed by highly reactive chemicals such as, e.g., HCl or HF mixed with $H_2SO_4$. However, these highly reactive chemicals cannot be applied in semiconductor processing.

Further, a bare aluminum surface is only stable for a short period of time because of the high forming rate of $Al_2O_3$ on bare aluminum. This conventionally requires in addition the usage of highly activating fluxes or specific salt mixtures that carry chloride and fluoride ions. The involvement of such species, however, imposes a high corrosion risk in semiconductor devices and is therefore not yet considered possible in semiconductor applications.

FIGS. 1A to 1I illustrate stages of various embodiments of a method of soldering a conductor to an aluminum metallization according to a first aspect of the disclosure. Referring to FIG. 1A, an aluminum metallization 110 is covered by an aluminum oxide layer 120. The aluminum oxide layer 120 may comprise or be of $Al_2O_3$. As mentioned above, the aluminum metallization 110 may, e.g., be a semiconductor chip electrode or a substrate or chip carrier such as, e.g., a leadframe, or a metallization on a substrate or chip carrier such as, e.g., a metallization on a PCB (printed circuit board) or a metallization on a ceramic substrate.

Furthermore, it is to be noted that the aluminum metallization 110 does not need to be of aluminum only but may be an aluminum alloy, i.e. may contain contributions of, e.g., Si and/or Cu and/or Mg and/or SiCu and/or other elements. For instance, the aluminum metallization 110 may be an AlSiCu alloy containing, e.g., 0% wt≤Cu≤5% wt and 0% wt≤Si≤1% wt. By way of example, the aluminum metallization 110 may be a 98.5 Al-1Si-0.5Cu (i.e. 98.5% wt of Al, 1% wt of Si, 0.5% wt of Cu) aluminum alloy. Such aluminum alloys, in particular AlMg, AlSi, AlCu, or AlSiCu, will also be referred herein as an "aluminum metallization".

The aluminum oxide layer 120 may have a thickness of several nm, e.g. a thickness of up to 2 nm or a thickness of up to 5 nm. An aluminum oxide layer 120 of such thickness forms a very stable passivation layer which cannot be removed easily via a conventional acidic treatment.

In the following, several possibilities are disclosed how to substitute the $Al_2O_3$ layer with a less stable metal oxide or metal alloy oxide without a corrosive impact to the semiconductor device (e.g. semiconductor chip).

Figure 1B:
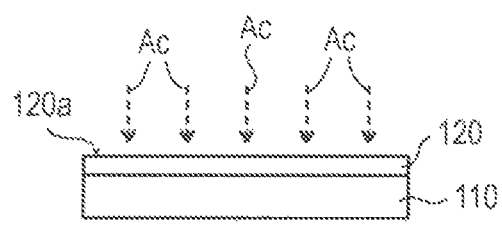
FIG. 1B is a cross-sectional view illustrating exemplary activation processes of the aluminum oxide layer of FIG. 1A.

According to several embodiments, the process of substituting the aluminum oxide layer on the aluminum metallization by a substitute metal or substitute metal alloy oxide layer may comprise activation. FIG. 1B schematically illustrates several examples for activating the aluminum oxide layer 120. Activating the aluminum oxide layer 120 may have the meaning of decreasing the stability of the aluminum oxide layer 120. In particular, activating the aluminum oxide layer 120 may have the meaning of removing partly or completely the aluminum oxide which has been formed previously. The process of activating the aluminum oxide layer 120 is an optional process which can be omitted in several embodiments.

A possibility of activating the aluminum oxide layer 120 may comprise applying one or more of HF (hydrofluoric acid) and MSA (methanesulfonic acid) to the aluminum oxide layer 120. By way of example, pure MSA or a mixture of HF and MSA may be applied. The application of HF and/or MSA is indicated by arrows Ac. By way of example, a mixture of HF and MSA in an aqueous solution may be directly disposed on an upper (exposed) surface 120a of the aluminum oxide layer 120. Fluoride ions may form complexes with the aluminum oxide layer 120 at the upper surface 120a and may finally also form $AlF_3$ which can be dissolved later in an acidic solution. The dissolution of the $Al_2O_3$ with HF and/or MSA decreases the stability of the aluminum ($Al_2O_3$) layer 120.

A further possibility of (optionally) activating the aluminum oxide layer 120 for decreasing its stability includes the application of fluorine via a RF (radio frequency) plasma process to the aluminum oxide layer 120. A mixture of Ar and $CF_4$ gas may be used in the plasma process. During this process fluorine is incorporated into the aluminum oxide layer 120. More specifically, the aluminum oxide layer 120 may form $AlF_3$ during the plasma process. As mentioned above, the fluorinated aluminum oxide layer 120 has a decreased stability and may, e.g., be dissolved later.

The above concept of applying fluorine for (optionally) activating the aluminum oxide layer 120 for decreasing its stability may be generalized to the concept of incorporation of halogenides, e.g. one or more of F, Cl, Br, and J to activate the aluminum oxide layer 120 by weakening the aluminum oxide layer 120.

Several possibilities are available and may, e.g., be combined if desired:
(1) Plasma treatment of $Al_2O_3$ with fluorocarbon containing plasmas such as, e.g., $CHF_3$, $C_2F_2$, $CH_3F$ or $CF_4$ gases or gas mixtures, e.g. also mixed with one or more of Ar, He, $O_2$, $H_2$ or $H_2O$. Again, F may be substituted by other halogenides.
(2) Plasma treatment of $Al_2O_3$ with other fluorine or chlorine compound plasmas such as, e.g., $SF_6$, $CHCl_3$, $CH_2Cl_2$, $CH_3Cl$, $CCl_3$.
(3) Plasma treatment of $Al_2O_3$ with brominated or iodized organic molecules that leads to incorporation of these halogens into the $Al_2O_3$ layer leading to a weakening of this layer.

During the plasma treatment of the $Al_2O_3$ with a halogenide-based plasma a specific mixture of aluminum-oxyfluorides are forming which are less stable and can be soldered with standard flux-solderpastes or even a solderwire in conditions described further below. Usual contents of halogenides (e.g. fluorine-based) in the $Al_2O_3$ layer may be measured with Auger depth profiles. Taking fluorine as an example, a F/O atomic concentration ratio of, e.g., about 0.5 is observed at the F maximum peak over sputter time. Atomic concentration ratios at the maximum F content (or, in general, halogens content) along the $Al_2O_3$ layer thickness between 0.01 and 10 have been observed and may be suitable for soldering of aluminum due to the weakened $Al_2O_3$ layer. As will be explained further below, the treatment (activation) of the $Al_2O_3$ with a halogenide-based plasma can also be used as a "stand alone" process where the $Al_2O_3$ with the incorporated halogen is directly soldered. "Stand alone" here means that no conversion of the $Al_2O_3$ layer by a process of substituting the aluminum by another metal or metal alloy may be needed in this case.

All these approaches for activating the aluminum oxide layer 120 (i.e. the application of HF/MSA in an aqueous solution, the application of an Ar/$CF_4$ gas mixture during an RF plasma process and the incorporation of halogens or halogenides into the aluminum oxide layer 120) may be combined. Further, additional processes of pre-treating the aluminum metallization 110 to weaken the stability of the aluminum oxide layer 120 thereon may be added.

Figure 1C:
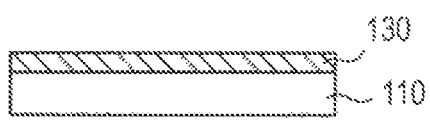
FIG. 1C is a cross-sectional view illustrating exemplary substitution processes of the aluminum oxide layer of FIG. 1A or FIG. 1B by a substitute metal oxide layer or a substitute metal alloy oxide layer.

Referring to FIG. 1C, the (e.g. activated) aluminum oxide layer 120 is then replaced by a substitute metal oxide layer 130 or substitute metal alloy oxide layer 130. This substitute layer will be referred herein as the substitute metal or substitute metal alloy oxide layer 130.

The substitute metal which is used to form the substitute metal or substitute metal alloy oxide layer 130 may, e.g., be Zn, Cr, Cu, Pb, or Sn. These metals may be used to substitute $Al_2O_3$ with lower free enthalpy of formation. By way of example, the enthalpy of formation $DGf^0$ of some substitute metal oxides are given in the following table.

| metal oxide | $DGf^0$ [kJ/mol] |
| --- | --- |
| ZnO | 300 |
| CuO | 146 |
| $Cu_2O$ | 129.7 |
| PbO | 189.93 |

-continued

| metal oxide | DGf° [kJ/mol] |
|---|---|
| PbO$_2$ | 217.33 |
| SnO | 256.9 |
| SnO$_2$ | 438.2 |

These metal oxides can be dissolved from low activated fluxes and can be reduced into their metallic state during soldering in reductive atmosphere.

In particular, when a substitute metal alloy oxide layer of Zn or Cr is formed, the substitute metal alloy may include at least two of the elements Zn, Cr, V, and Mo. More specifically, the substitute metal or substitute metal alloy may consist of one of Zn, Cr, ZnCr, CrZn, and alloys thereof including one or more of V and Mo.

The substituting may comprise depositing the substitute metal or substitute metal alloy over the (e.g. previously activated) aluminum oxide layer 120. According to a first possibility, an electrochemical deposition process may be used. This electrochemical deposition process may include the usage of an electrochemical cell which includes a cathode, an anode and a compartment for the electrolyte between the electrodes. By way of example, an alkaline electrolyte may be used.

In the following, without loss of generality, Zn will be used as an example of the substitute metal. However, the disclosure herein analogously encompasses other metals or metal alloys such as, e.g., Cr as an example of a substitute metal.

For example, a bare Zn layer may be deposited over the (e.g. previously activated) aluminum oxide layer 120. Alkaline electrolytes, which may be used, are, e.g., $Zn(OH)_4^{2-}$ with cyanide or without cyanide. Alternatively, acidic or neutral electrolytes such as, e.g., $ZnSO_4$ or $ZnCl_2$ based electrolytes, $ZnSO_4$ with $NH_4^+$, $ZnSO_4$ without $NH_4^+$, $Zn^{2+}$ with $NH_4Cl$ etc., may also be used to apply a bare Zn layer.

These or other bare Zn-based electrolytes may also include additives such as, e.g., chromate (Cr) and/or vanadate (V) and/or molybdate (Mo). In these cases, a ZnCr and/or ZnV and/or ZnMo metal alloy layer may be deposited as substitute metal alloy over the aluminum oxide layer 120 by electrochemical deposition. For ZnCr and/or ZnV and/or ZnMo alloy layer deposition, also an alkaline electrolyte can be used. In this case, the alkaline electrolyte contains Cr ions and/or V ions and/or Mo ions and may show anomalous co-deposition behavior of Cr and/or V and/or Mo together with Zn. The Cr and/or V and/or Mo content of the ZnCr and/or ZnV and/or ZnMo alloy layer may be equal to or higher than 1% wt, in particular 5% wt, and may be equal to or less than 40% wt, with the rest is Zn and, optionally, minor contributions of other elements such as, e.g., Si, etc.

By way of example, for the deposition of a ZnCr alloy layer an electrolyte including or consisting of 12 g/L NaOH, 0.9 g/L $Zn^{2+}$, 0.6 g/L $Cr^{6+}$ and, optionally, 70 ppm $Si^{4+}$ may be used. The ZnCr alloy layer may contain hexavalent Cr.

The Zn metal layer or the ZnCr and/or ZnV and/or ZnMo metal alloy layer may have a thickness of equal to or greater than 1, 5, 10, 20, 40, 60, or 80 nm. The Zn metal layer or the ZnCr and/or ZnV and/or ZnMo metal alloy layer may have a thickness of equal to or less than 100, 80, 40, 20, 10, or 5 nm.

A second possibility of depositing the substitute metal or substitute metal alloy over the aluminum oxide layer 120 is to use an electroless deposition process. An electroless deposition process may comprise a chemical exposure of the upper surface 120a of the aluminum oxide layer 120 to an electrolyte without the application of a current. By way of example, all of the above-mentioned electrolytes may be used, and it is possible to apply all substitute metal or substitute metal alloys (e.g. bare Zn or ZnCr, ZnV, ZnMo alloys) which are mentioned above. The chemical exposure may be obtained by, e.g., a dip process of the aluminum metallization 110 in the electrolyte cell. By way of example, the aluminum metallization 110 (together with the aluminum oxide layer 120 thereon) may be dipped into the electrolyte for about 15 to 60 seconds.

All the exemplary processes described above result in a substitution of the aluminum oxide layer 120 by a substitute metal or substitute metal alloy oxide layer 130. With the substitution of the $Al_2O_3$ layer 120 by deposition of a Zn or ZnCr or ZnV or ZnMo layer, the oxides ZnO, ZnCr-oxide, ZnV-oxide or ZnMo-oxide, respectively, are formed. With these new oxides formed and the $Al_2O_3$ vanished, the layer replacing the aluminum oxide layer 120 (i.e. the substitute metal or substitute metal alloy oxide layer 130) can more easily be reduced during subsequent processing since ZnO or the ZnCr-/ZnV-/ZnMo-oxides are thermodynamically less stable compared to $Al_2O_3$. As will be described in more detail further below, this reduction in stability may facilitate or already allow subsequent soldering on the aluminum metallization 110.

It is to be noted that the substitution of the aluminum oxide layer 120 by the substitute metal or substitute metal alloy oxide layer 130 is accompanied by a structural and morphologic change of the layer. More specifically, the substitute metal or substitute metal alloy oxide layer 130 may have a sponge-like, porous, dendritic or otherwise inhomogeneous structure.

In the following, some specific examples are described for the substitution process (optionally including activation). These examples may be combined with features of activating and/or depositing as described above.

Example A

Substitution may comprise HF/MSA activation and a plating process with an alkaline electrolyte that is depositing a 1-100 nm thick ZnCr alloy layer. In addition or alternatively, an electrolyte can be used to apply a bare Zn layer.

Example B

Following an optional HF/MSA activation, a Cr-free electrolyte using an electrolyte of a bare zincate or zincate with vanadate or molybdate (instead of chromate, see Example A) may be used.

Example C

A dip process in each of the electrolytes mentioned in Example A and Example B can be performed for substituting. A dip is a short (e.g. 1 to 120 s) exposure of the aluminum oxide surface with the respective electrolyte used, one of the Following an optional HF/MSA activation, a Cr-solution without application of a current. During the dip, the aluminum oxide is substituted by the respective Zn or Zn alloy layer.

Example D

A plasma process (such as, e.g., described above) with incorporation of the substituting metal into the aluminum oxide layer can be used. To this end, a metalorganic molecule gas may be added to the plasma and used as a source of the substitution metal to form the "soft substitute metal oxide".

Example E

A sputtering process may be used to sputter the substitute metal onto the $Al_2O_3$ layer in order to get a mixed oxide between $Al_2O_3$ and the metal oxide, e.g. AlCu oxide or AlZn oxide.

Figure 1D:
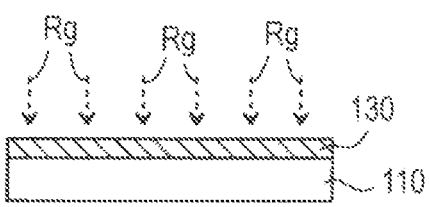
FIG. 1D is a cross-sectional view illustrating exemplary reduction of the substitute metal oxide layer or the substitute metal alloy oxide layer of FIG. 1C.

Referring to FIG. 1D, the substitute metal or substitute metal alloy oxide layer 130 is at least partly reduced. A first possibility to at least partly reduce this layer is to apply a reducing gas at elevated temperature for reducing the substitute oxides (e.g. ZnO and/or ZnCr-oxide and/or ZnMo-oxide and/or ZnV-oxide, etc.) of the substitute metal or substitute metal alloy oxide layer 130. The application of a reducing gas is indicated in FIG. 1D by arrows Rg.

When applying a reducing gas, according to a first example a so-called forming gas comprising a mixture of $H_2$ and an inert gas such as, e.g., $N_2$, may be used as a reducing gas. In the following, without loss of generality, $N_2$ is taken as an example of the inert gas.

A forming gas $N_2/H_2$ may have a concentration of $H_2$ in the range of 0.001% to 10%. In particular, a $N_2/5\%\ H_2$ forming gas may be used.

The elevated temperature of the reducing gas, when applied to the substitute metal or substitute metal alloy oxide layer 130, may be in a range between 150° C. and 500° C. More specifically, the elevated temperature of the reducing gas Rg may be equal to or less than or greater than 500° C., 450° C., 400° C., 380° C., 350° C., 330° C., 300° C., 270° C., 250° C., 220° C., or 200° C. In particular, a temperature of 330° C.±30° C. may be used.

The pressure of the reducing gas Rg may be in a range between $10^{-5}$ Pa and $10^7$ Pa. In particular, a pressure of about $10^{-3}$ Pa within a margin of, e.g., $10^{-4}$ Pa to $10^{-2}$ Pa may be used. By way of example, ZnO is reduced from $N_2/5\%\ H_2$ already at a temperature of 330° C. at a pressure of $10^{-3}$ Pa.

According to a second example, the reducing gas Rg may comprise a mixture of an inert gas (e.g. $N_2$) and $CH_2O_2$ (formic acid). $CH_2O_2$ may be used in a concentration in the range between 0.01% and 10% in the inert gas. In particular, a concentration of 3% formic acid in $N_2$ may be used.

A reducing gas Rg of $N_2/CH_2O_2$ may be applied at temperatures in the same range or even below the temperatures mentioned for the application of a $N_2/H_2$ forming gas. The applied pressure of $N_2/CH_2O_2$ reducing gas Rg may be in the same range as mentioned for the $N_2/H_2$ forming gas. By way of example, ZnO is reduced from $N_2/CH_2O_2$ even at lower temperatures of equal to or less than 250° C. at a pressure of $10^{-3}$ Pa.

It is also possible to apply a mixture of the above-mentioned reducing gases Rg (i.e. a mixture of $H_2$ and $CH_2O_2$ in an inert gas) within the same temperature and/or pressure ranges as mentioned above.

Other reducing gases which may be applied are ethanol, acetone, propanol, ethene and homologues, ethyne and homologues or other volatile agents that can form active (reductive) hydrogen on the surface leading to the formation of, e.g., a bare metal surface. For these other reducing gases, the same ranges of pressure and/or temperature apply as mentioned above.

The application of a reducing gas Rg for reducing the substitute metal oxide or substitute metal alloy oxide in the substitute metal or substitute metal alloy oxide layer 130 may optionally be enhances by the application of an RF (radio frequency) plasma or a microwave plasma (MW). For instance, reductive gases or radicals can also come from plasma treatment of the less stable metal oxides with $H_2$ or H-containing gases (e.g. $CHF_3$, $CH_2F_2$, $CH_3F$, $CH_4$, etc., or gas mixtures thereof) in chemical or in RF plasmas.

Figure 2:
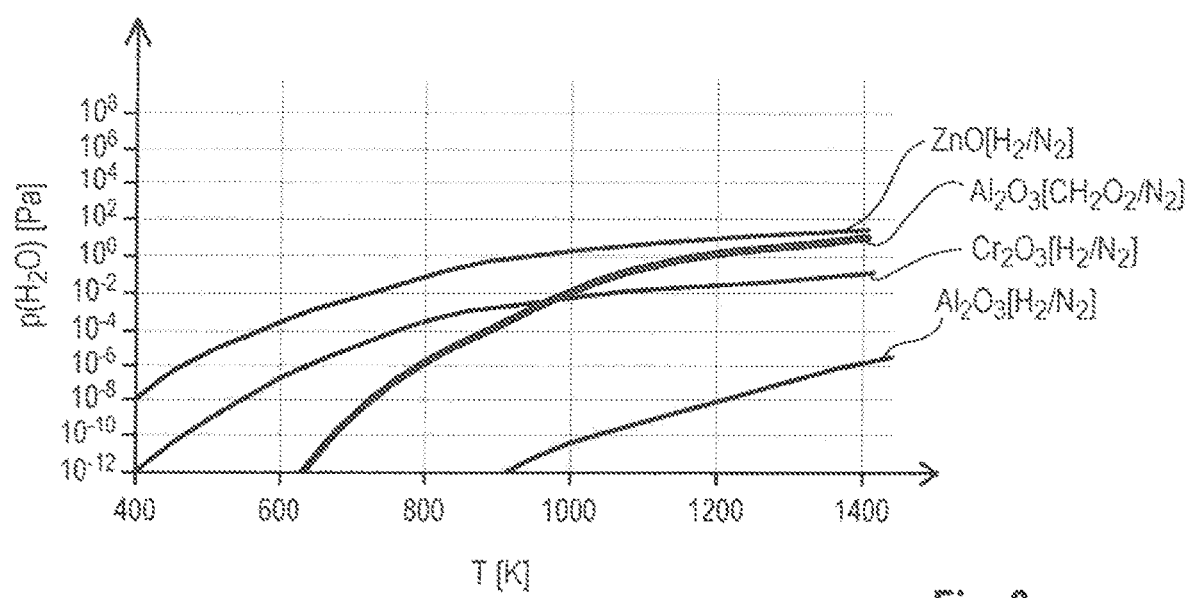
FIG. 2 is a diagram illustrating calculated equilibrium pressures p in units of Pa of $H_2O$ for the metal oxides $Al_2O_3$, $Cr_2O_3$, and ZnO in a reducing gas of 5% $H_2$ in $N_2$ (forming gas) and for the metal oxide $Al_2O_3$ in a reducing gas of $CH_2O_2$ in $N_2$ versus temperature T in units of K.

More specifically, FIG. 2 illustrates calculated equilibrium pressures p in units of Pa of $H_2O$ for various metal oxides in the two reducing gases Rg mentioned above versus temperature in units of K. The equilibrium reactions in the forming gas of $H_2$ in $N_2$ are

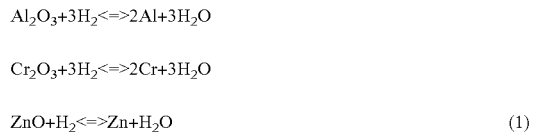

$$ZnO+H_2 \mathrel{<\!=\!>} Zn+H_2O \qquad (1)$$

and the equilibrium reaction in the reducing gas of $CH_2O_2$ in $N_2$ is

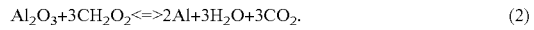

From FIG. 2 it is apparent that the reduction of ZnO and $Cr_2O_3$ in $N_2/H_2$ is possible at significantly lower temperature than the reduction of $Al_2O_3$ in $N_2/H_2$, i.e. the thermodynamic stability of the aforementioned substitute metal oxides is significantly smaller than the thermodynamic stability of aluminum oxide. Further, FIG. 2 illustrates that $CH_2O_2$ is more effective in reducing aluminum oxide than $H_2$. Although the higher efficiency of $CH_2O_2$ is illustrated in FIG. 2 only for aluminum oxide, it also holds true for the reduction of the substitute metal oxides (i.e. ZnO and/or $Cr_2O_3$, etc.). Further, FIG. 2 illustrates that the reduction of the substitute metal oxide(s) is already possible at temperatures which can readily be applied during semiconductor processing.

Figure 1E:
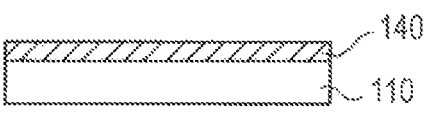
FIG. 1E is a cross-sectional view illustrating the aluminum metallization after the reduction process of FIG. 1D.

Referring to FIG. 1E, reduction of the substitute metal oxide(s) in the substitute metal or substitute metal alloy oxide layer 130 generates the (oxide-reduced) substitute metal or substitute metal alloy layer 140. This (oxide-reduced) substitute metal or substitute metal alloy layer 140 will no longer contain ZnO and/or other oxides of the substitute metal(s). As will be described further below, the reduction by, e.g., usage of a reducing gas Rg may enable soldering of the aluminum metallization 110 without the usage of highly activating fluxes or even without the usage of any fluxes. In addition, this enables soldering of the aluminum metallization 110 in general with a minimum influence of corrosive attack during the activation/substitution treatment as the activation of the aluminum via dissolution of the $Al_2O_3$ is occurring during, e.g., electrochemical deposition of the substitution metal (e.g. Zn or Zn-alloy). The attack and substitution of the $Al_2O_3$ with the "soft metal oxide" is in this case additionally supported by the deposition current at the cathode.

FIGS. 1F to 1I illustrate stages of an exemplary process of soldering a conductor 150 to the aluminum metallization 110 when covered by an (oxide-reduced) substitute metal or substitute metal alloy layer 140 as produced, e.g., by the reduction process of FIG. 1D.

Figure 1F:
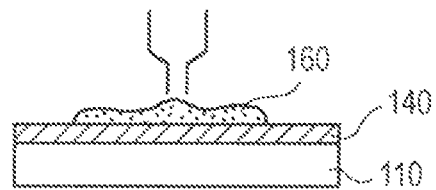
FIG. 1F is a cross-sectional view illustrating exemplary application of a solder deposit over the aluminum metallization of FIG. 1E.

According to FIG. 1F, a solder deposit 160 is disposed over the aluminum metallization 110. More specifically, the solder deposit 160 is applied to the (oxide-reduced) substitute metal or metal alloy layer 140.

The application of the solder deposit 160 may be performed by standard solder attach processes. The solder deposit 160 comprises a solder material and may comprise a flux. The solder material may, e.g., contain Pb. By way of example, a PbSnAg solder may be used. By way of example, a 95.5Pb-2Sn-2.5Ag solder (i.e. a solder having a composition of 95.5% wt of Pb, 2% wt of Sn and 2.5% wt of Ag) or a SnAgCu solder or a Sb—Sn solder or any other standard solder conventionally used for semiconductor chip soldering can be used.

The soldering to the aluminum metallization 110 is done with metals contained as a contribution in the solder material that are reacting with aluminum by forming intermetallic phases. Metals that undergo a reaction with aluminum are, e.g., Cu, Ni, Ti, V, Zn, Fe, Ta, and/or W (Sn, however, does not undergo a reaction with aluminum). These metals (i.e. the metal(s) that form(s) an intermetallic phase(s) with aluminum) may be provided by various ways:

According to one possibility this or these metal(s) may be contained as a contribution in the material of the conductor 150 (i.e. the soldering partner), e.g. a clip. According to another possibility, the metal(s) may be alloyed in the solder material as a mixture. Further, it is possible that the metal(s) are provided by metal particles in the solder material. The metal(s) can further be provided via plating the metals onto a solder-wire or by providing the metal(s) in the form of metalorganic molecules as a part of the flux.

The above mentioned possibilities of how to apply the metal(s) for the intermetallic phase(s) may be combined. By way of example, the composition of the solder material may contain a contribution of a metal which forms or is included in the conductor 150. If the conductor 150 has a surface facing the solder deposit 160 which comprises or is of, e.g., Cu, Ni, Cu/Ni, NiP, Ni/NiP or alloys thereof, the solder material may also contain a contribution of Cu, Ni, Cu/Ni, NiP, Ni/NiP or alloys thereof.

As a further example, a 95.5Pb-2Sn-2.5Ag solder and a conductor 150 (e.g. clip) consisting of Cu and a Cu—Fe—P alloy was used.

Standard lowly activating flux (which is not overly corrosive) or no fluxes may be used in the soldering process. In particular, no highly activating fluxes such as fluxes destined for $Al_2O_3$ reduction need to be used. Rather, the activation of the aluminum metallization 110 by dissolution of the aluminum oxide layer 120 was accomplished during the electrochemical or electroless deposition of the substitute metal or substitute metal alloy on the aluminum oxide layer 120, see FIG. 1B. This substitute metal or substitute metal alloy deposition activation has a minimum impact of corrosive attack and therefore enables soldering on the aluminum metallization 110 in semiconductor device manufacturing as considered herein.

The application of the solder deposit 160 may be performed in a vacuum soldering furnace (not shown). For example, the solder deposit 160 may be dispensed in form of a solder paste over the aluminum metallization 110.

It is to be noted that application of the solder deposit 160 (see FIG. 1F) and the aforementioned process of reducing the substitute metal oxide(s) may be accomplished in one and the same soldering furnace. In particular, the soldering process may be performed in the reducing gas Rg atmosphere used for the oxide reduction process. In general, when using a reducing gas Rg, the process of at least partly or completely reducing the substitute metal oxide(s) in the substitute metal oxide or substitute metal alloy oxide layer 130 may be performed prior to or during the process of soldering the conductor to the aluminum metallization 110.

Figure 1G:
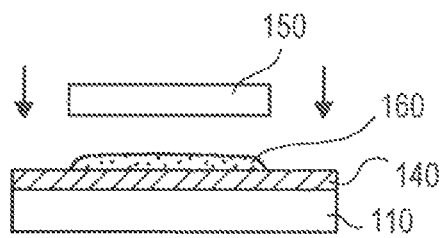
FIG. 1G is a cross-sectional view illustrating exemplary placement of a conductor onto the solder deposit of FIG. 1F.
Figure 1H:
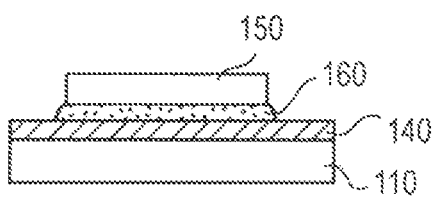
FIG. 1H is a cross-sectional view illustrating exemplary soldering and cooling of the conductor placed onto the solder deposit according to FIG. 1G.

FIG. 1G illustrates the placement of the conductor 150 to the liquid solder deposit 160. The solder deposit 160 may then cool to, e.g., 50° C. to 80° C. and solidifies during this process (FIG. 1H).

Figure 1I:
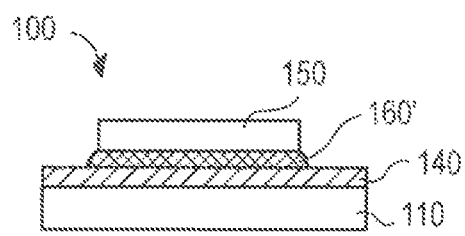
FIG. 1I is a cross-sectional view illustrating an example of a conductor soldered to an aluminum metallization by exemplary processes as illustrated, e.g., in FIGS. 1A to 1H.

FIG. 1I illustrates an arrangement 100 comprising the conductor 150 bonded to the aluminum metallization 110 by a solidified solder layer 160'. The solidified solder layer 160' may directly contact the (oxide-reduced) substitute metal or substitute metal alloy layer 140. That way, the conductor 150 is mechanically fixed and electrically connected to aluminum metallization 110.

According to a second possibility to at least partly reduce the substitute metal or substitute metal alloy oxide layer 130, the process of reducing the substitute metal oxide(s) by the application of a reducing gas Rg (FIG. 1D) may be omitted. Rather, the reduction of the substitute metal oxide(s) may be performed during the subsequent soldering process. This process will exemplarily be described below with reference to FIGS. 3A to 3D.

Figure 3A:
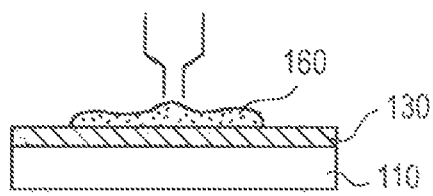
FIG. 3A is a cross-sectional view illustrating an exemplary application of a solder deposit over the aluminum metallization of FIG. 1C.

In this case, according to FIG. 3A, the solder deposit 160 is applied to the aluminum metallization 110. More specifically, however, the solder deposit 160 is applied to the substitute metal or substitute metal alloy oxide layer 130 (of FIG. 1C) rather than to the (oxide-reduced) substitute metal or substitute metal alloy layer 140 of FIG. 1E. That is, no substitute metal or substitute metal alloy oxide reduction (FIG. 1D) has been performed.

The application of the solder deposit 160 may be performed by standard solder attach processes. The solder deposit 160 comprises a solder material and may comprise a flux. The solder material may, e.g., contain Pb. In particular, the same PbSnAg solder as mentioned above in conjunction with FIG. 1F could be used.

By way of example, a 95.5Pb-2Sn-2.5Ag solder (i.e. a solder having a composition of 95.5% wt of Pb, 2% wt of Sn and 2.5% wt of Ag) or a SnAgCu solder or a Sb—Sn solder or any other standard solder and standard low activated flux conventionally used for semiconductor chip soldering can be used. Usual fluxes used in semiconductor soldering which can also be used here are low activated and based on colophony (rosin) or other organic acids such as malonic acid or oxalic acid. Soldering can also be done as a solder-wire or solder-preform based solder process with either flux or in reductive atmosphere.

Further, the same compositions of the solder material and/or compositions of the conductor 150 as mentioned above in the context of intermetallic phase formation can be used. The solder material may contain a contribution of a metal which forms or is contained in the conductor 150. Reference is made to the corresponding disclosure above.

The application of the solder deposit 160 may be performed in a vacuum soldering furnace (not shown). For example, the solder deposit 160 may be dispensed in form of a solder paste over the aluminum metallization 110.

Standard lowly activating fluxes for semiconductor device soldering (i.e. fluxes which are not overly corrosive) may be used in the soldering process. In particular, no highly activating fluxes need to be used. As already described above and referred to in this context, the activation of the aluminum metallization 110 by dissolution of the aluminum oxide layer 120 has been performed during preceding processing (i.e. was caused during the electrochemical or electroless deposition of the substitute metal or substitute metal alloy on the aluminum oxide layer 120, see FIG. 1B).

The substitute metal oxide(s) (e.g. ZnO and/or $Cr_2O_3$, etc.) are reduced by direct contact of the solder deposit 160 with the substitute metal or substitute metal alloy oxide layer 130. More specifically, an (oxide-reduced) substitute metal or substitute metal alloy layer region 140_1 having, e.g., the same composition as the (oxide-reduced) substitute metal or substitute metal alloy layer 140 of FIG. 1E is generated from the substitute metal or substitute metal alloy oxide layer 130 in a region where the solder deposit 160 contacts or overlaps the substitute metal or substitute metal alloy oxide layer 130. Laterally outside the overlapping region, the substitute metal oxides of the substitute metal or substitute metal alloy oxide layer 130 are not reduced, i.e. the (oxide-reduced) substitute metal or substitute metal alloy layer region 140_1 may be surrounded by an unchanged region 130_1 of the substitute metal or substitute metal alloy oxide layer 130 (FIG. 3B).

Figure 3B:
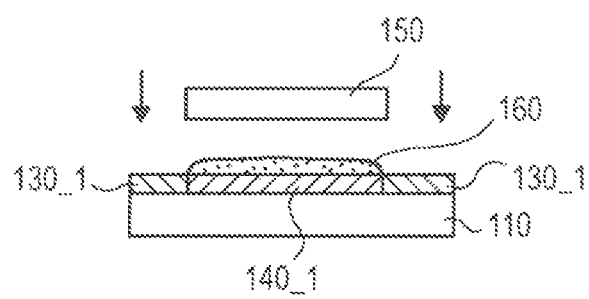
FIG. 3B is a cross-sectional view illustrating exemplary placement of a conductor onto the solder deposit of FIG. 3A.

FIG. 3B further illustrates the placement of the conductor 150 to the liquid solder deposit 160. The solder deposit 160 may then cool to, e.g., 50° C. to 80° C. and solidifies during this process as described in conjunction with FIG. 1H.

Figure 3C:
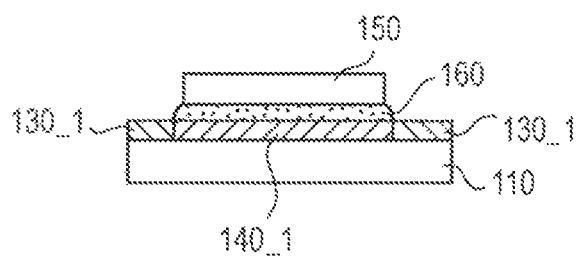
FIG. 3C is a cross-sectional view illustrating exemplary soldering and cooling of the conductor placed onto the solder deposit according to FIG. 3B.
Figure 3D:
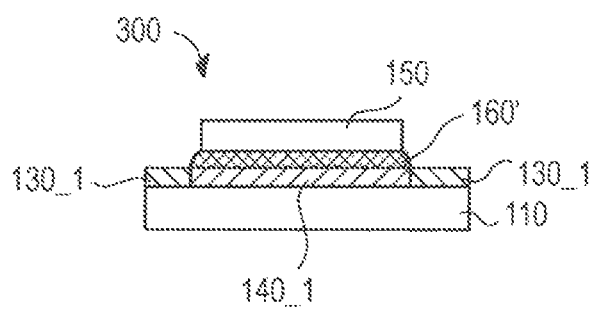
FIG. 3D is a cross-sectional view illustrating an example of a conductor soldered to an aluminum metallization by exemplary processes as illustrated, e.g., in FIGS. 1A to 1C followed by exemplary processes as illustrated, e.g., in FIGS. 3A to 3C.

FIGS. 3C and 3D correspond to FIGS. 1H and 1I, respectively, and reference is made to the description above to avoid reiteration. With the conductor 150 being mechanically fixed and electrically connected to the aluminum metallization 110 by the solidified solder layer 160', the difference between the processes shown in FIGS. 1D to 1I (overall oxide reduction by applying a reducing gas Rg) and FIGS. 3A to 3D (localized oxide reduction by contacting with the solder deposit 160) remain detectable in the finalized arrangement 300 by the provision of the unchanged region 130_1 of the substitute metal or substitute metal alloy oxide layer 130. That is, the (oxide-reduced) substitute metal or substitute metal alloy layer region 140_1 is confined to a region of the same shape as the solidified solder layer 160' and surrounded by the unchanged region 130_1 of the substitute metal oxide or substitute metal alloy oxide layer. The solidified solder layer 160' may directly contact the (oxide-reduced) substitute metal or substitute metal alloy layer region 140_1.

According to a second aspect of the disclosure, as illustrated by way of examples in FIGS. 4A to 4D, no conditioning or activation of the aluminum oxide layer 120 on the aluminum metallization 110 is required. Instead, removal of the aluminum oxide may be reached by applying a flux material to the aluminum oxide layer 120 on the aluminum metallization 110 and by disposing a solder material over the aluminum metallization, wherein the solder material has a substantial content of Zn. More specifically, the chemical composition of the solder material may be x % wt≤Zn≤100% wt, with x=10, 30, 50, 70, 90, 95 or 100.

The rest of the chemical composition of the solder material may contain one or more of Al, Cu, Ni, Ti and, optionally, residual components as mentioned above. In particular, a solder material consisting mainly or exclusively of Zn and Al (i.e. ZnAl or AlZn or an alloy thereof with the above composition) may be used. The higher the Zn content, the more effective is the solder material in removing the aluminum oxide from the aluminum metallization, i.e. in reducing the aluminum oxide during soldering together with the flux material.

In order to prevent any halogenide-catalyzed corrosion, other molecules are added to dissolve the $Al_2O_3$ effectively. A first possibility is to add silicates, e.g. specific silicates such as zeolites to the flux material. By way of example, silicates (or zeolites) in the concentration range of 0.01% wt to 10% wt in relation to the flux content may be added. Silicates (or zeolites) are effective in decreasing the corrosive impact of the flux material.

For example, the flux material may be a mixture of at least flux and silicate (zeolite), the flux material having a chemical composition of x % wt≤silicate and/or silicate≤x % wt, with x=0.1, 0.5, 1.0, 2.0, 4.0, 6.0, or 8.0. The rest of the chemical composition of the flux material may be a (highly activated) flux capable of reducing $Al_2O_3$.

A further possibility to decrease the corrosive impact via halogenides is the addition of crown ether to the flux. By way of example, crown ether in the concentration range of 0.01% wt to 50% wt in relation to the flux content may be added. By way of example, the flux material may be a mixture of at least flux and crown ether, the flux material having a chemical composition of x % wt≤crown ether and/or crown ether≤x % wt, with x=0.1, 0.5, 1, 5, 10, 20, 30, or 40. The rest of the chemical composition of the flux material may be a (highly activated) flux capable of reducing $Al_2O_3$.

Both measures of reducing the corrosive impact of the flux material (i.e. the addition of silicates (e.g. zeolites) and the addition of crown ethers to flux) may be combined. Silicates (e.g. zeolites) and/or crown ethers may be helpful to minimize corrosion as they may catch anions and cations during and after the soldering process. Further, besides silicates and crown ether, other aluminum complexing agents may be added to the flux in the concentration range of 0.01% wt to 10% wt in relation to the flux content.

The reduction of the corrosive impact of the flux material by, e.g., one or more of the above measures allows to use highly activating fluxes in the flux material for semiconductor device soldering.

Figure 4A:
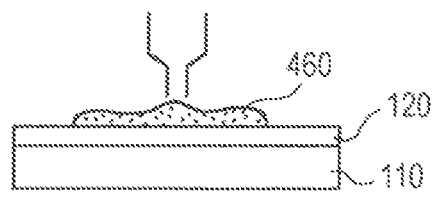
FIG. 4A is a cross-sectional view illustrating an exemplary application of a solder paste over the aluminum metallization of FIG. 1A.

Referring to FIG. 4A, a solder paste 460 is applied over the aluminum metallization 110. The aluminum metallization 110 still comprises the aluminum oxide layer 120. The same application/dispensing processes as described in conjunction with FIG. 1F may be applied. The flux material and the solder material may, e.g., already be mixed together before application to form the solder paste 460. The solder material may have a composition as stated above and the flux material may have a composition as stated above.

Figure 4B:
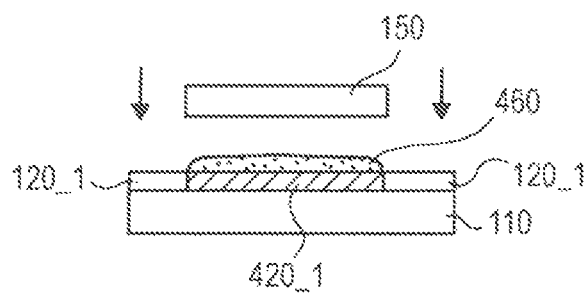
FIG. 4B is a cross-sectional view illustrating exemplary placement of a conductor onto the solder paste of FIG. 4A.

During or after application the solder paste 460 is heated and the conductor 150 is placed on the solder paste 460 (FIG. 4B). Similar processes as described in conjunction with FIGS. 3A and 3B may be applied, and reference is made to the above disclosure. In particular, the soldering process may be supported by the application of a reducing gas and/or by the application of an RF-plasma as described in conjunction with FIGS. 1D to 1G. As described above, placement of the conductor 150 (FIG. 4B) and soldering (FIG. 4C) may, e.g., be performed in a tunnel furnace (not shown).

Still referring to FIG. 4B, the aluminum oxide of the aluminum oxide layer 120 is reduced by direct contact of the solder paste 460 with the aluminum oxide layer 120. More specifically, an (oxide-reduced) aluminum region 420_1 is generated from the aluminum oxide layer 120 in a region where the solder paste 460 contacts or overlaps the aluminum oxide layer 120. Laterally outside the overlapping region, the aluminum oxide layer 120 is not reduced, i.e. the (oxide-reduced) aluminum region 420_1 may be surrounded by an unchanged region 120_1 of the aluminum oxide layer 120 (FIG. 4B).

The aluminum metallization 110 may consist of bare aluminum or an aluminum alloy as described above. In particular, an aluminum alloy 98.5Al-0.5Cu-1Si or 99Al-1Si front side metallization may be used. The conductor 150 to be soldered to the aluminum metallization 110 may comprise or be of the same materials as mentioned above, e.g. of Cu, Ni, Cu/Ni, NiP, Ni/NiP or alloys thereof. These substances refer to the composition of the surface region of the conductor 150 which effectively provides the material that contributes to the intermetallic compound generated during soldering. The intermetallic compound is generated during soldering by the reaction of the solder material with the surface region of the conductor and the aluminum metallization 110 (or, more specifically, the (oxide-reduced) aluminum region 420_1).

Then, the solder paste 460 is cooled to solidify and to provide for a mechanical and electrical connection. Reference is made to the description of FIGS. 1H, 1I and 3C, 3D, which may be identically applied to the processes illustrated by FIGS. 4C and 4D, respectively, with the exception that no intermediate (oxide-reduced) substitute metal or substitute metal alloy layer 140 (see FIGS. 1H, 1I) or (oxide-reduced) substitute metal or substitute metal alloy layer region 140_1 (FIGS. 3C, 3D) is provided between the solidified solder paste 460' and the aluminum metallization 110. Rather, the solidified solder paste 460' may directly connect to the aluminum metallization 110 (via the (oxide-reduced) aluminum region 420_1 of a thickness of only a few nm).

Figure 4C:
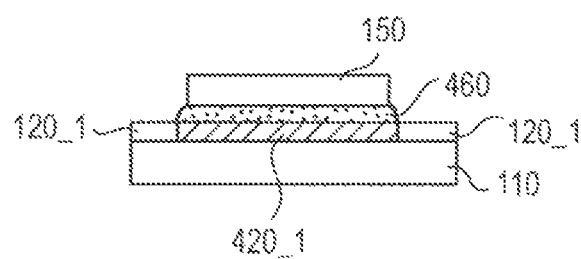
FIG. 4C is a cross-sectional view illustrating exemplary soldering and cooling of the conductor placed onto the solder paste according to FIG. 4B.
Figure 4D:
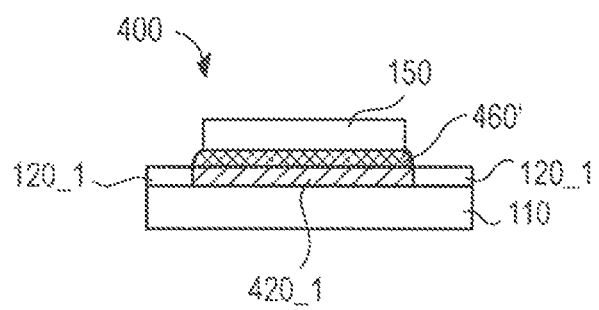
FIG. 4D is a cross-sectional view illustrating an example of a conductor soldered to an aluminum metallization by exemplary processes as illustrated, e.g., in FIG. 1A, followed by exemplary processes as illustrated, e.g., in FIGS. 4A to 4C.

FIG. 4D is a cross-sectional view illustrating an example of an arrangement 400 comprising the conductor 150 soldered to the aluminum metallization 110 by exemplary processes as illustrated, e.g., in FIG. 1A, followed by exemplary processes as illustrated, e.g., in FIGS. 4A to 4C.

FIGS. 5A to 5F illustrate stages of various embodiments of a method of soldering a conductor to an aluminum metallization according to a third aspect of the disclosure. According to a third aspect of the disclosure, no conversion of the $Al_2O_3$ layer by a process of substituting the aluminum by another metal or metal alloy as described for the first aspect of the disclosure is needed.

Figure 5A:
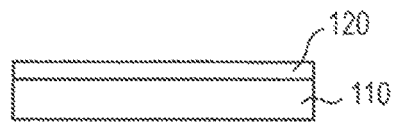
FIG. 5A is a cross-sectional view illustrating an example of an aluminum metallization and an aluminum oxide layer on the aluminum metallization.

Referring to FIG. 5A, an aluminum metallization 110 is covered by an aluminum oxide layer 120. Reference is made to the description of FIG. 1A to avoid reiteration.

Figure 5B:
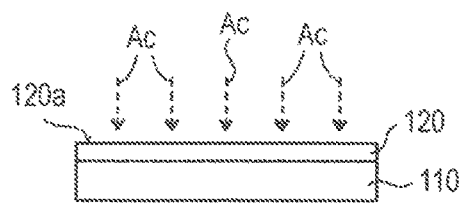
FIG. 5B is a cross-sectional view illustrating exemplary activation processes of the aluminum oxide layer of FIG. 1A.
Figure 5C:
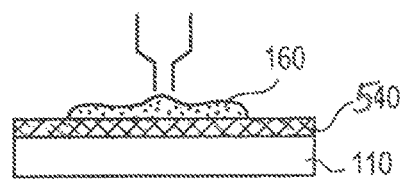
FIG. 5C is a cross-sectional view illustrating exemplary application of a solder deposit over the aluminum metallization of FIG. 5B.
Figure 5D:
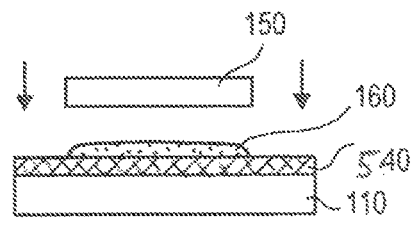
FIG. 5D is a cross-sectional view illustrating exemplary placement of a conductor onto the solder deposit of FIG. 5C.
Figure 5E:
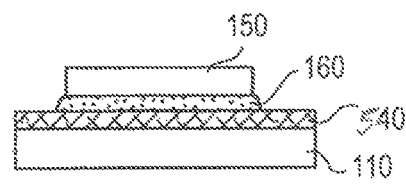
FIG. 5E is a cross-sectional view illustrating exemplary soldering and cooling of the conductor placed onto the solder deposit according to FIG. 5D.
Figure 5F:
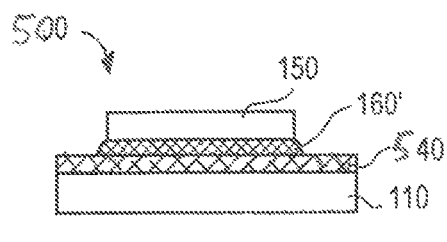
FIG. 5F is a cross-sectional view illustrating an example of a conductor soldered to an aluminum metallization by exemplary processes as illustrated, e.g., in FIGS. 5A to 5E.

FIG. 5B schematically illustrates several examples for activating the aluminum oxide layer 120. Activating the aluminum oxide layer 120 may have the meaning of decreasing the stability of the aluminum oxide layer 120. Here, the activation of the aluminum oxide layer 120 is performed by applying a halogenide via a plasma process to the aluminum oxide layer 120 on the aluminum metallization 110 to produce a halogenated aluminum oxide layer 540 (see FIG. 5C). That is, the activation (AC) of the aluminum oxide layer 120 for decreasing its stability may be achieved by the incorporation of halogenides, e.g. one or more of F, Cl, Br, and J.

Several possibilities are available and may, e.g., be combined if desired:
(1) Plasma treatment of $Al_2O_3$ with fluorocarbon containing plasmas such as, e.g., $CHF_3$, $C_2F_2$, $CH_3F$ or $CF_4$ gases or gas mixtures, e.g. also mixed with one or more of Ar, He, $O_2$, $H_2$ or $H_2O$. Again, F may be substituted by other halogenides.
(2) Plasma treatment of $Al_2O_3$ with other fluorine or chlorine compound plasmas such as, e.g., $SF_6$, $CHCl_3$, $CH_2Cl_2$, $CH_3Cl$, $CCl_3$.
(3) Plasma treatment of $Al_2O_3$ with brominated or iodized organic molecules that leads to incorporation of these halogens into the $Al_2O_3$ layer leading to a weakening of this layer.

During the plasma treatment of the $Al_2O_3$ with a halogenide-based plasma a specific mixture of aluminum-oxyfluorides are forming which are less stable and can be soldered with standard flux-solderpastes or even a solderwire. Standard flux-solderpastes can be solderpastes containing fluxes which are usually used in semiconductor soldering, such as low activated fluxes based on kolophonium or other organic acids such as malonic acid or oxalic acid.

As already mentioned, usual contents of halogenides (e.g. fluorine-based) in the $Al_2O_3$ layer may be measured with Auger depth profiles. Taking fluorine as an example, a F/O atomic concentration ratio of, e.g., about 0.5 is observed at the F maximum peak over sputter time. Atomic concentration ratios at the maximum F content (or, in general, halogens content) along the $Al_2O_3$ layer thickness between 0.01 and 10 have been observed and may be suitable for soldering of aluminum due to the weakened $Al_2O_3$ layer.

In contrast to the (optional) activation as describe in conjunction with FIG. 1B, according to the third aspect of the disclosure the treatment (activation) of the $Al_2O_3$ with a halogenide-based plasma is used as a "stand alone" process. "Stand alone" here means that no conversion of the $Al_2O_3$ layer by a process of substituting the aluminum by another metal or metal alloy is used. Rather, the halogenated aluminum oxide layer 540 (i.e. the $Al_2O_3$ layer with the incorporated halogen) is directly soldered.

FIGS. 5C to 5F illustrate stages of an exemplary process of soldering a conductor 150 to the aluminum metallization 110 to manufacture an arrangement 500. Except the replacement of the (oxide-reduced) substitute metal or substitute metal alloy layer 140 by the halogenated aluminum oxide layer 540, FIGS. 5C to 5F correspond to FIGS. 1F to 1I, respectively, and reference is made to the above description to avoid reiteration.

Figure 6:
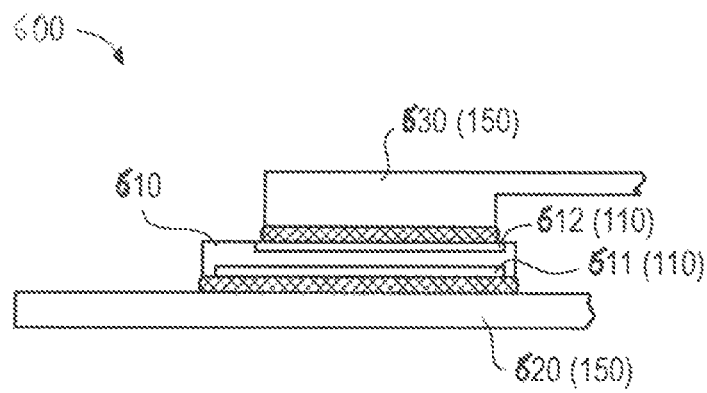
FIG. 6 is a cross-sectional view illustrating an exemplary arrangement of a conductor and an aluminum metallization soldered together, wherein the conductor is a chip carrier or a clip and the aluminum metallization is a chip electrode.

Generally, soldering can be done on aluminum chip metallizations (chip electrodes) and/or on aluminum conductors such as, e.g., chip carriers and/or clips. FIG. 6 illustrates an exemplary arrangement 600 of a conductor 150 and an aluminum metallization 110 soldered together. In this example, the aluminum metallization 110 is formed by a first electrode 611 of a semiconductor chip 610 and the conductor 150 is formed by a chip carrier 620, e.g. a leadframe. The semiconductor chip 610 may, e.g., be a power device having, e.g., a vertical structure. The first electrode 611 of the semiconductor chip 610 may, e.g., either be a drain electrode (drain-down orientation) of the semiconductor chip 610 or a source electrode (source-down orientation) of the semiconductor chip 610.

Further referring to FIG. 6, the conductor 150 to be soldered to the aluminum metallization 110 may be a clip 630 and the aluminum metallization 110 may again be a chip electrode, e.g. a second chip electrode 612. The second chip electrode 612 may be a source electrode (drain-down orientation) or a drain electrode (source-down orientation) of the semiconductor chip 610.

Chip carrier 620 (150) soldering and/or clip 630 (150) soldering of the semiconductor chip 610 may be accomplished subsequently or simultaneously. Any of the above mentioned processes, materials, techniques etc. may be applied. In particular, all arrangements 100, 300, 400, 500 described above for soldering of a conductor 150 to an aluminum metallization 110 may be applied in the arrangement 500 for chip carrier 620 (150) soldering and/or clip 630 (150) soldering of the electrodes 611 (110) and/or 612 (110) of the semiconductor chip 610.

Figure 7:
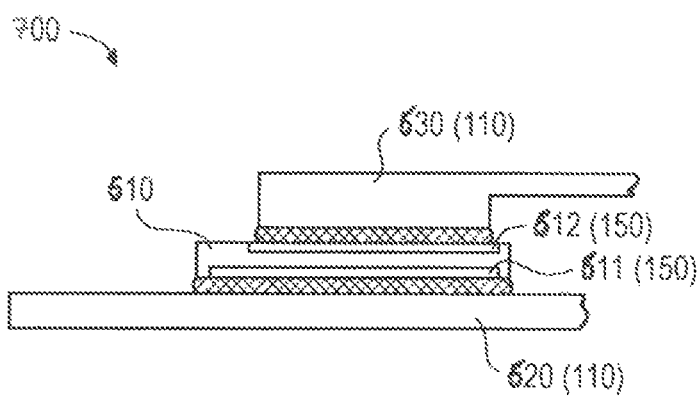
FIG. 7 is a cross-sectional view illustrating an exemplary arrangement of a conductor and an aluminum metallization soldered together, wherein the conductor is a chip electrode and the aluminum metallization is a chip carrier or a clip.

According to a further possibility depicted in FIG. 7, an exemplary arrangement 700 may include chip electrodes 611 and/or 612 which represent the conductor 150 and are made of, e.g., one or more of the above mentioned materials of the conductor 150. In this case, the chip carrier 620 such as, e.g., a leadframe provides for the aluminum metallization 110 and/or the clip 630 provides for the aluminum metallization 110. Again, source-down or drain-down orientations are possible and both semiconductor electrodes 611 and 512 may be soldered subsequently or simultaneously to the chip carrier 620 (110) and to the clip 630 (110). In particular, all arrangements 100, 300, 400, 500 described above for soldering of a conductor 150 to an aluminum metallization 110 may be applied in the arrangement 700 for chip carrier 620 (110) soldering and/or clip 630 (110) soldering of the electrodes 611 (150) and/or 612 (150) of the semiconductor chip 610.

Although specific embodiments have been illustrated and described herein, it will be appreciated by those of ordinary skill in the art that a variety of alternate and/or equivalent implementations may be substituted for the specific embodiments shown and described without departing from the scope of disclosure. This application is intended to cover any adaptations or variations of the specific embodiments discussed herein.

What is claimed is:

1. A method of soldering a conductor to an aluminum metallization, the method comprising:
   substituting an aluminum oxide layer on the aluminum metallization by a substitute metal oxide layer or a substitute metal alloy oxide layer;
   at least partly reducing a substitute metal oxide in the substitute metal oxide layer or in the substitute metal alloy oxide layer, wherein at least partly reducing comprises applying a reducing gas at elevated temperature to the substitute metal oxide layer or the substitute metal alloy oxide layer; and
   soldering the conductor to the aluminum metallization using a solder material.

2. The method of claim 1, wherein a substitute metal of the substitute metal oxide layer is one of Zn, Cr, Cu, Pb, or Sn.

3. The method of claim 2, wherein substituting comprises depositing the substitute metal over the aluminum oxide layer by an electrochemical deposition process or by an electroless deposition process.

4. The method of claim 1, wherein a substitute metal alloy of the substitute metal alloy oxide layer comprises at least two of the elements Zn, Cr, V, Cu, Pb, Sn and Mo.

5. The method of claim 4, wherein substituting comprises depositing the substitute metal alloy over the aluminum oxide layer by an electrochemical deposition process or by an electroless deposition process.

6. The method of claim 1, wherein substituting comprises applying one or more of hydrofluoric acid (HF) and methanesulfonic acid (MSA) to the aluminum oxide layer.

7. The method of claim 1, wherein substituting comprises applying a halogenide via a plasma process to the aluminum oxide layer.

8. The method of claim 1, wherein the reducing gas comprises one or more of $H_2$, $CH_2O_2$, ethanol, propanol, acetone.

9. The method of claim 1, wherein the elevated temperature is equal to or less than 500° C.

10. The method of claim 1, wherein the at least partly reducing comprises applying a lowly activating flux during soldering the conductor to the aluminum metallization.

* * * * *